(12) United States Patent
Ollier

(10) Patent No.: US 10,340,434 B2
(45) Date of Patent: Jul. 2, 2019

(54) COMBUSTION MODULE HAVING SUBSTANTIALLY UNIFORM TEMPERATURE

(71) Applicant: Commissariat a l'Energie Atomique et aux Energies Alternatives, Paris (FR)

(72) Inventor: Emmanuel Ollier, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 560 days.

(21) Appl. No.: 15/000,473

(22) Filed: Jan. 19, 2016

(65) Prior Publication Data

US 2016/0225975 A1    Aug. 4, 2016

(30) Foreign Application Priority Data

Jan. 20, 2015 (FR) ..................... 15 50450

(51) Int. Cl.
*H01L 35/30* (2006.01)
*F23B 50/00* (2006.01)
(Continued)

(52) U.S. Cl.
CPC ............. *H01L 35/30* (2013.01); *F23B 10/00* (2013.01); *F23B 10/02* (2013.01); *F23B 30/00* (2013.01);
(Continued)

(58) Field of Classification Search
CPC ...... H01L 35/30; H01L 31/0547; F23B 10/00; F23B 40/00; F23B 10/02; F23B 50/00;
(Continued)

(56) References Cited

U.S. PATENT DOCUMENTS 4,473,044 A  *  9/1984  Hudson ................... F02D 17/02
                                                    123/198 F
4,520,305 A  *  5/1985  Cauchy ............... F28D 15/0275
                                                    136/208
(Continued)

FOREIGN PATENT DOCUMENTS

WO    WO 88/02061 A1    3/1988
WO    WO 2014/048992 A1    4/2014

OTHER PUBLICATIONS

European Search Report dated Sep. 13, 2016 in Patent Application No. 16151958.2 (with English Translation of Category of Cited Documents).
(Continued)

*Primary Examiner* — Magali P Slawski
*Assistant Examiner* — Michael Y Sun
(74) *Attorney, Agent, or Firm* — Oblon, McClelland, Maier & Neustadt L.L.P.

(57) ABSTRACT

A combustion module including a body in which are formed several combustion chambers extending parallel to each other along a longitudinal direction between a first end face and a second end face of the body in which they emerge, the distance between the combustion chambers and/or the dimensions of the combustion chambers are chosen so as to reduce a temperature gradient transversal to the combustion chambers.

16 Claims, 4 Drawing Sheets

(51) Int. Cl.
*F23B 30/00* (2006.01)
*F23B 40/00* (2006.01)
*F23B 10/02* (2011.01)
*F23B 10/00* (2011.01)
*F23C 6/02* (2006.01)
*F23C 3/00* (2006.01)
*F23C 5/00* (2006.01)
*F23C 6/00* (2006.01)
*F23C 7/00* (2006.01)
*F23C 9/00* (2006.01)
*F23B 60/00* (2006.01)
*F23B 70/00* (2006.01)
*F23B 80/00* (2006.01)
*F23B 90/00* (2011.01)
*H01L 31/054* (2014.01)

(52) U.S. Cl.
CPC .............. *F23B 40/00* (2013.01); *F23B 50/00* (2013.01); *F23C 3/002* (2013.01); *F23C 6/02* (2013.01); *F23B 60/00* (2013.01); *F23B 70/00* (2013.01); *F23B 80/00* (2013.01); *F23B 90/00* (2013.01); *F23C 3/00* (2013.01); *F23C 5/00* (2013.01); *F23C 6/00* (2013.01); *F23C 7/00* (2013.01); *F23C 9/00* (2013.01); *H01L 31/0547* (2014.12)

(58) Field of Classification Search
CPC .......... F23B 30/00; F23B 80/00; F23B 90/00; F23B 60/00; F23B 70/00; F23C 3/002; F23C 6/02; F23C 7/00; F23C 6/00; F23C 3/00; F23C 5/00; F23C 9/00
See application file for complete search history.

(56) References Cited

U.S. PATENT DOCUMENTS

| 4,767,467 | A  * | 8/1988  | Holland   | H01L 35/00 |
|           |      |         |           | 136/201 |
| 6,313,393 | B1 * | 11/2001 | Drost     | H01L 35/30 |
|           |      |         |           | 136/201 |
| 7,862,331 | B2   | 1/2011  | Norton et al. | |
| 2004/0035457 | A1 * | 2/2004 | Kribus | F02G 1/0435 |
|           |      |         |           | 136/205 |
| 2005/0155639 | A1 * | 7/2005 | Perlo | F23C 99/006 |
|           |      |         |           | 136/205 |
| 2006/0021645 | A1 * | 2/2006 | Marshall | F23C 13/00 |
|           |      |         |           | 136/211 |
| 2007/0131183 | A1 * | 6/2007 | Shei | F02B 73/00 |
|           |      |         |           | 123/48 R |
| 2010/0101621 | A1 * | 4/2010 | Xu | C09K 5/063 |
|           |      |         |           | 136/206 |
| 2010/0263701 | A1 * | 10/2010 | Yazawa | H01L 23/38 |
|           |      |         |           | 136/203 |
| 2012/0260962 | A1 * | 10/2012 | Caroff | C01B 3/323 |
|           |      |         |           | 136/201 |
| 2014/0047822 | A1   | 2/2014 | Oesterle et al. | |

OTHER PUBLICATIONS

French Preliminary Search Report dated Sep. 14, 2015 French Application 15 50450, filed Jan. 20, 2015 (with English Translation of Categories of Cited Documents).

* cited by examiner

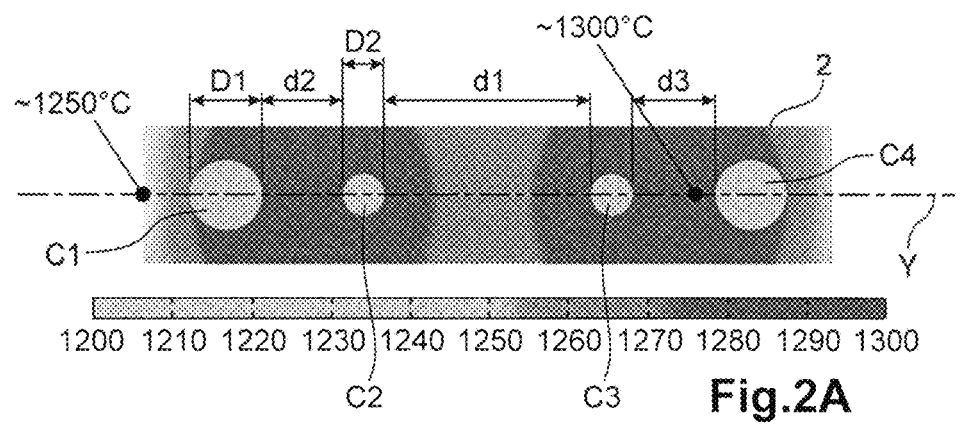
Fig. 2A
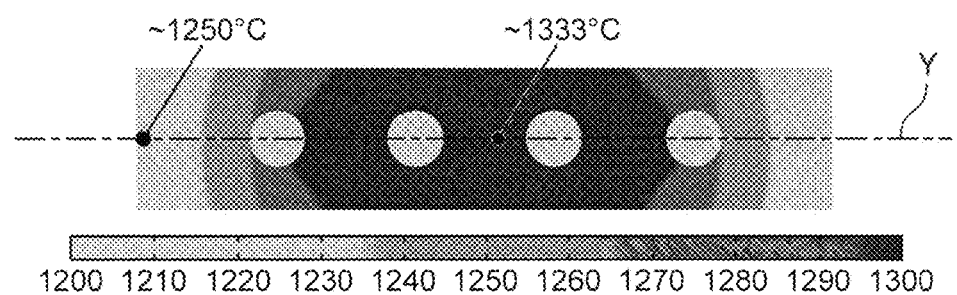
Fig. 2B
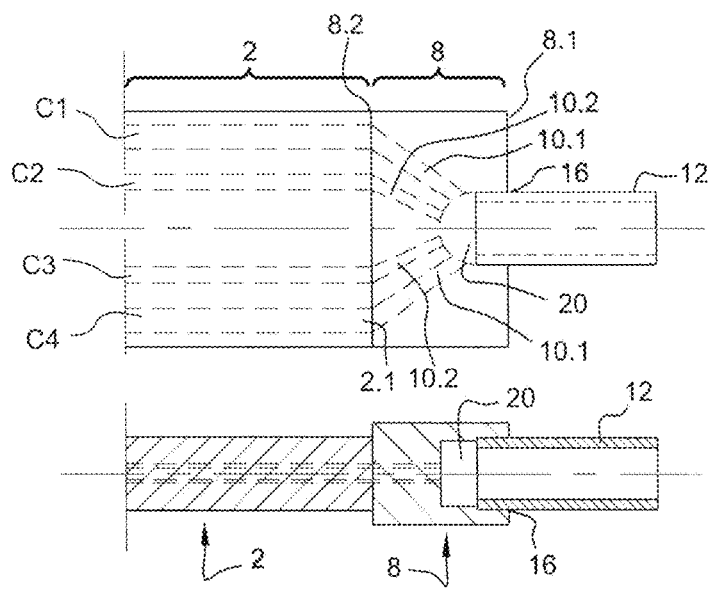
Fig. 3A
Fig. 3B

COMBUSTION MODULE HAVING SUBSTANTIALLY UNIFORM TEMPERATURE

TECHNICAL FIELD AND PRIOR ART

The present invention relates to a combustion module having substantially uniform temperature, notably in a direction transversal to the direction of the combustion chambers, and to a hybrid solar system comprising at least one such combustion module.

Electricity production devices exist comprising a combustion module and a thermoelectric module, the hot face of the thermoelectric module being in contact with one of the faces of the combustion module. By burning one or more gases in the combustion module, the face of the thermoelectric module in contact with the combustion module is heated, a temperature gradient appears in the thermoelectric module, there is then production of electricity.

An example of such a device is described in the document U.S. Pat. No. 7,862,331.

The combustion module comprises a chamber supplied with gas via at least one supply pipe, the combustion gases are evacuated via at least one evacuation conduit.

The material of the module has very good thermal conductivity since it is desired to use the heat produced in the module outside of the module.

The document WO2014/048992 describes a hybrid solar device for producing electricity comprising a module of which a first face is subjected to solar radiation, a second face is in contact with a thermoelectric generator and for example a combustion chamber between the first face and the second face. The combustion chambers are of tubular shape and are arranged next to each other and parallel to the first face subjected to solar radiation and to the second face in contact with the thermoelectric generator.

Yet it is noted that, when the combustion chambers are burning, the module does not have a uniform temperature, notably in a direction transversal to the combustion chambers. The lateral zones are substantially colder than the central zone of the module. The result is that the face in contact with the thermoelectric generator does not have a substantially homogenous temperature over its whole surface, which may be damaging for the operating efficiency of the thermoelectric generator. The same problem is posed if the thermoelectric generator is replaced by a thermophotovoltaic cell converting the infrared radiation emitted by the module, this radiation is not uniform over its whole surface. In both cases, the temperature non-uniformity also generates thermomechanical stresses which may be damaging for the reliability of the component.

DESCRIPTION OF THE INVENTION

It is consequently an aim of the present invention to offer a combustion module comprising a body provided with several combustion chambers, offering a substantially uniform heating of the body.

The aforementioned aim is attained by a combustion module comprising a body in which are formed several combustion chambers extending parallel with respect to each other between a first end face and a second end face of the body, the distance between the chambers and/or the dimensions of the chambers are chosen so as to obtain substantially uniform heating of the body, notably in a direction transversal to the combustion chambers.

In other words, the combustion chambers are distributed in the body and/or their dimensions are adapted such that the thermal energy delivered by each of the combustion chambers makes it possible to obtain at least one reduction in the transversal temperature gradient.

Preferably, a module is formed in which combustion chambers having the greatest transversal section are situated close to the lateral edges. In this way thermal losses are compensated at the lateral edges. Advantageously, the combustion chambers situated in the central zone are moved away from each other so as to limit heating in the central zone of the module in which heat is naturally confined.

Very advantageously, one or more heat insulating connectors are provided at the end faces through which the combustion chambers are supplied and the combustion gases are evacuated.

The subject matter of the present invention is therefore a combustion module comprising a body in which are formed several combustion chambers extending parallel to each other along a longitudinal direction between a first end face and a second end face of the body, the distance between the combustion chambers and/or the dimensions of the combustion chambers are chosen so as to reduce a temperature gradient transversal to the combustion chambers.

In an example of embodiment, the body comprises two lateral faces and first combustion chambers situated near to the lateral faces and second combustion chambers arranged between the first combustion chambers, the first combustion chambers having a transversal section greater than the second combustion chambers.

In another example of embodiment, the body comprises two lateral faces and first combustion chambers situated near to the lateral faces and second combustion chambers arranged between the first combustion chambers, and a distance separating two second combustion chambers being greater than a distance separating a first combustion chamber and a second combustion chamber.

Preferably, the combustion chambers are catalytic combustion chambers.

The inner surfaces of the combustion chambers are advantageously at least in part covered with at least one catalyst material, for example platinum, capable of causing a combustion of one or more gases.

The combustion module may comprise at least one first connector in contact with the first end face of the body and intended to assure the connection between the combustion chambers and at least one source of at least one gas and/or a zone for evacuating combustion gases, said connector having a thermal conductivity substantially lower than that of the body.

The module may comprise a second connector in contact with the second end face of the body and intended to assure the connection between the combustion chambers and at least one source of at least one gas and/or a zone for evacuating combustion gases, said connector having a thermal conductivity substantially lower than that of the body.

The first connector may be intended to connect the combustion chambers and at least one source of at least one gas, said first connector comprising a supply orifice intended to be connected to the gas source by a conduit, as many channels as connection chambers, said channels connecting the supply orifice and the combustion chambers.

Each channel advantageously has a section similar to or identical to that of the combustion chamber to which it is connected.

Preferably, the first connector comprises a distribution chamber downstream of the supply orifice and upstream of the channels.

In an example of embodiment, the first connector comprises at least two inlet orifices and as many outlet orifices as combustion chambers, a network for distributing gas between the inlet orifices and the outlet orifices, and a mixing zone situated downstream of the two inlet orifices and upstream of the distribution network.

The first connector may advantageously comprise a structure capable of favoring the mixing of gases, for example a porous structure.

For example, the body is made of SiC and the supply connector and the evacuation connector are made of zirconium oxide.

The subject matter of the present invention is also a combustion device comprising at least one combustion module according to the invention, at least one source and one conduit connected to the inlet orifice of the supply connector and to the gas source.

The subject matter of the present invention is also a hybrid solar system comprising means for concentrating solar radiation, at least one combustion module according to the invention or one combustion device according to the invention, the module or the device being arranged such that concentrated radiation illuminates one face of the body and means for converting thermal energy into electricity on one face opposite to that illuminated by the concentrated solar radiation, and means for controlling combustion in the combustion module as a function of the concentrated solar radiation. The means for concentrating solar radiation comprise for example at least one Fresnel mirror or lens.

BRIEF DESCRIPTION OF THE DRAWINGS

The present invention will be better understood with the help of the description that follows and the appended drawings, in which:

FIG. 2A is a transversal sectional view of the module of FIG. 1 in which the operating temperatures are symbolized by grey levels, FIG. 2B is a transversal sectional view of the module of the prior art in which the temperatures during operation are symbolized by grey levels, FIGS. 3A and 3B are top and longitudinal sectional views respectively of an example of embodiment of a combustion module according to the invention comprising a heat insulating connector.

DETAILED DESCRIPTION OF PARTICULAR EMBODIMENTS

Figure 1:
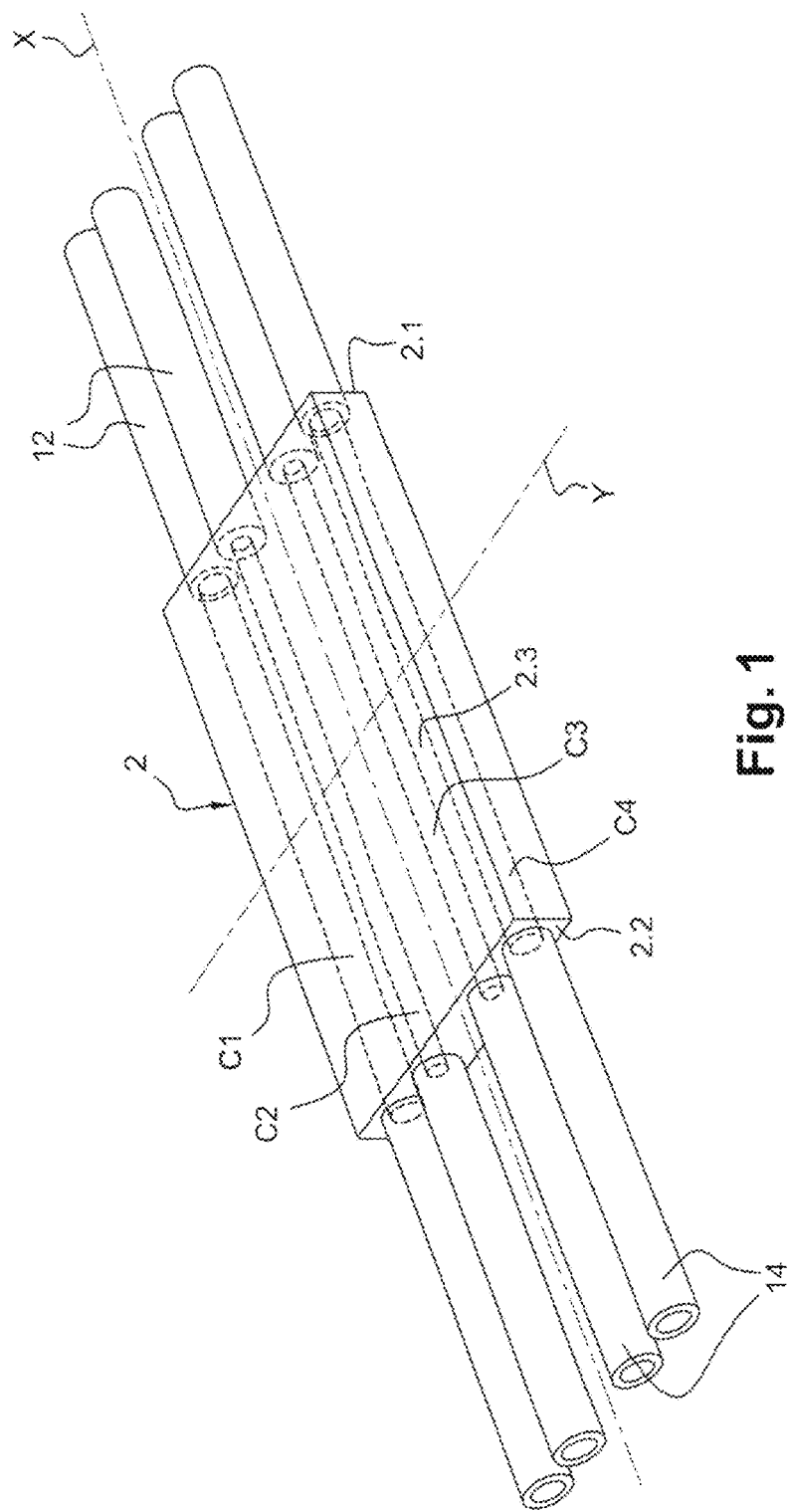
FIG. 1 is a transparent perspective view of an example of embodiment of a combustion module according to the invention.

In FIG. 1 may be seen an example of combustion module M1 comprising a body 2 including a plurality of combustion chambers C1, C2, C3, C4.

The body 2 extends along a longitudinal direction X and has a first longitudinal face 2.1 or first end face 2.1 and a second longitudinal face 2.2 or second end face 2.2. In the example represented, the body has the shape of a rectangular parallelepiped. It further comprises an upper face 2.3 and a lower face (not visible) which have larger surfaces and two lateral faces 2.4.

The combustion chambers C1, C2, C3, C4 extend parallel to a direction X.

In the example represented, each chamber C1, C2, C3, C4 is in the form of a tubular channel of which a first end emerges in the first face 2.1 and of which a second end emerges in the second face 2.2.

One end of each chamber C1, C2, C3, C4 is intended for the supply with one or more gases (combustible and oxidizing), designated hereafter "supply gas", with a view to combustion and another end of each chamber C1, C2, C3, C4 is intended for the evacuation of combustion gases and potential unburned gases.

The module comprises conduits 12 for supplying with gas the combustion chambers each connected to one of the ends of the combustion chambers and conduits 14 for evacuating combustion gases each connected to one of the ends of the combustion chambers. In the example represented in FIG. 1, the chambers are all supplied via their end situated in the end face 2.1 and are evacuated via their end situated in the end face 2.2.

In the example represented, the chambers C1 and C4 situated the most towards the exterior of the body, i.e. the closest to the lateral faces 2.4 of the body, have transversal sections greater than those of the chambers C2 and C3. In the example represented, the chambers being of transversal circular section, the diameter D1 of the chambers C1 and C4 is greater than the diameter D2 of the chambers C2 and C3.

The transversal section of the conduits 12 and 14 are adapted to that of the chambers to which they are connected.

Advantageously, the combustion chambers are of catalytic type. A catalyst material is provided in the combustion chambers to cause combustion. This catalyst material preferably covers the inner surface of the combustion chambers. The result is that the greater the inner surface of the combustion chamber, the greater the quantity of catalyst and thus the greater the amount of heat produced by combustion.

Platinum or palladium is for example implemented as hydrogen combustion catalyst. The catalysts may be pure or associated with oxides such as cerium oxide or alumina.

Thus the amount of heat produced in the chambers C1 and C4 is greater than that produced in the chambers C2 and C3.

The combustion could also be caused by the input of external energy such as an electric arc, or in the case of a hybrid solar system, by the input of heat by solar concentration. In the case of catalytic combustion, a larger diameter of chamber advantageously makes it possible to increase the heat produced given a larger reaction surface. A texturing of the reaction surface may also be advantageously provided. In the case of a gas phase reaction, a larger diameter of chamber advantageously makes it possible to increase the heat produced given a larger reaction volume.

Moreover, in the example represented and advantageously, the chambers are not spread out uniformly in the body, i.e. the transversal distances along the direction Y, separating the chambers, are different. In the example represented, the distance dl separating the two adjacent chambers C2 and C3 situated in a central zone of the body 2 is greater than that d2 separating the chambers C1 and C2 and that d3 separating the chambers C3 and C4.

The lateral faces 2.4 are naturally zones of thermal losses by radiation, convection and conduction with the exterior. Furthermore, the central zone of the body is less subject to thermal losses, consequently the increase in temperature is quicker and easier in the central zone than in the lateral zones of the body. By implementing combustion chambers generating more heat in the lateral zones compared to the combustion chambers in the central zone, the thermal losses compared to the central zone is compensated at least in part. Moreover, by moving the combustion chambers C2 and C3 away from each other, the amount of heat delivered in the central zone is reduced compared to that delivered in the lateral zones. There is then a trend to reduce the thermal gradient between the temperature in the central zone of the body and the temperature at the lateral edges.

In FIGS. 2A and 2B may be seen transversal sections of a combustion body according to FIG. 1 and according to the prior art respectively in which temperature maps are represented schematically, the grey levels representing different temperature values.

In FIG. 2B, a significant temperature difference between the central zone which is at around 1333° C. and the lateral edges which are at around 1220° C. is noted. The temperature gradient is then of the order of 113° C.

In FIG. 2A, the temperature in the body is around 1300° C. and the temperature on the lateral faces is around 1250° C., the temperature gradient is then of the order of 50° C. Thanks to the choice of the dimensions of the chambers and the distribution thereof, an appreciable reduction in the transversal temperature gradient in the body is obtained.

The modules considered for FIGS. 2A and 2B have the following characteristics:
 the body has a dimension along the direction X equal to 25 mm, a dimension along the direction Y equal to 25 mm and a dimension along a direction perpendicular to the directions X and Y equal to 5 mm;
 the combustion chambers C1 and C4 have a combustion diameter D1 equal to 2.5 mm;
 the combustion chambers C2 and C3 have a combustion diameter D2 equal to 1.5 mm,
 d2=d3=2.5 mm;
 d1=7.5 mm, and
 a total injected power of 400 W is injected into the inner walls due to catalytic combustion on the walls.

In the example represented, the module has a symmetrical structure with respect to a symmetry plane containing the X axis, which makes it possible very advantageously to reduce transversal thermal gradients in the body.

Preferably, the ratio D1/D2 is comprised between 1 and 5. Advantageously the ratio d1/d2 is comprised between 1 to 5, and preferably close to 2.

Advantageously, it is sought to have a temperature gradient less than 100° C., preferably less than 50° C.

It will be understood that a module in which the combustion chambers are spread out uniformly but in which it is the dimensions of the chambers which vary to reduce the transversal gradient and a module in which the combustion chambers all have the same dimensions but the distribution of which makes it possible to reduce the transversal temperature gradient do not go beyond the scope of the present invention.

In the example represented, the combustion chambers have a circular section but chambers having another section, for example ellipsoidal or rectangular, do not go beyond the scope of the present invention.

In a variant, it is possible to provide that supply and evacuation conduits connected to different chambers are connected on a same end face of the body, which has the advantage of even further making uniform the temperature of the body but at the longitudinal ends of the body. For example, the combustion chambers may for example be supplied by a $H_2$/air mixture. In a variant they may be supplied by a $H_2/O_2$ mixture.

In another variant, the combustion chambers may be supplied by a $H_2/CH_4$/air mixture, the quantity of $CH_4$ being small compared to that of $H_2$.

In another variant, the combustion chambers may be supplied by a $CH_3OH$/air mixture. It is then preferable to preheat the intake mixture, for example to at least 200° C. This preheating may advantageously by obtained by solar energy in the case of a combustion system implemented in a hybrid solar system.

In FIGS. 3A and 3B may be seen an example of embodiment of a combustion module comprising a connector 8 mounted on the end face 2.1 of the body 2. The connector 8 comprises channels 10.1, 10.2 connected to each of the combustion chambers. The transversal section of the channels is identical to or similar to those of the combustion chambers to which they are connected. In the example represented, the channels 10.1 have a section equal to that of the chambers C1 and C4 and the channels 10.2 have a section equal to that of the chambers C2 and C3. It should be noted that for the channels 10.21, 10.2 extending at an angle with respect to the direction of the combustion chambers, it is the section of the channels in the plane of the end face 8.2 which is to be considered.

The connector 8 is made of a heat insulating material, i.e. having reduced thermal conductivity compared to the material of the body. The material of the connector 8 advantageously has a thermal conductivity less than 50 W/m.K, preferentially less than 10 W/m.K. Advantageously the material of the evacuation connector also has a thermal conductivity less than 50 W/m.K, preferentially less than 10W/m.K. The thermal conductivity of the material of the connector 8 is preferably at least 5 times less than that of the body.

The connector 8 is intended to connect the combustion chambers to a supply gas source.

The connector comprises a longitudinal end face 8.1 and a longitudinal end face 8.2 in contact with the end face 2.1.

The end face 8.1 comprises a single supply orifice 16 connected to a conduit 12 connected to a source of combustible and channels 10.1, 10.2 extending between the supply orifice 16 and the face 8.2 in which they emerge.

Figure 3C:
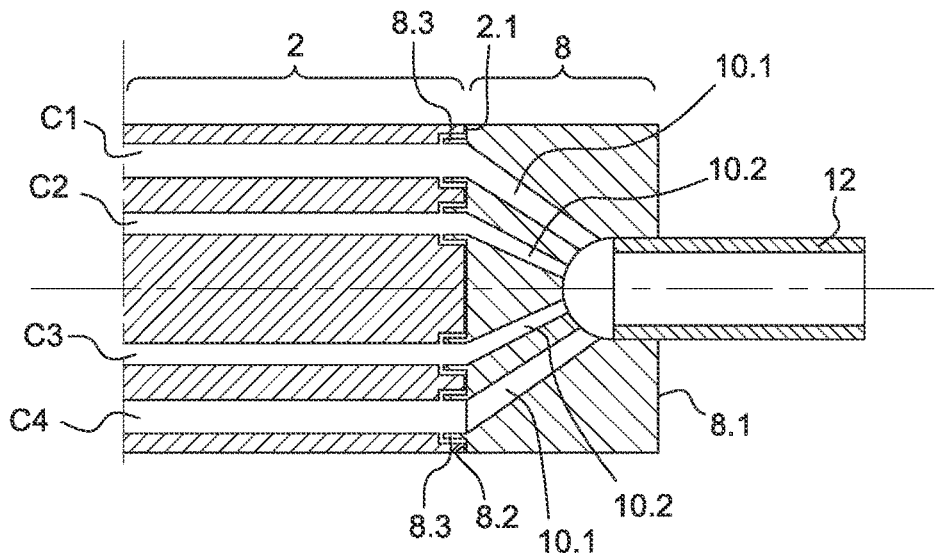
FIG. 3C is a sectional view of another example of embodiment of a combustion module according to the invention comprising a heat insulating connector.

For example as is represented in FIG. 3C, the end face 8.2 may comprise annular projections 8.3 surrounding the ends of the channels 10 emerging in the face 6.2, the annular projections 6.3 being inserted in the first end face of the body.

In this example of embodiment, a mixture of gases, for example $H_2$ and $O_2$, are pre-mixed before circulating in the connector 6 and supplying the combustion chambers.

Advantageously and as is represented, a chamber 20 is arranged downstream of the supply orifice 16 and upstream of the inlet of the channels, forming a distribution chamber. Preferably, the distribution chamber 20 contains a structure favoring mixing, such as a porous structure or a discontinuous structure.

The connector 8 made of heat insulating material makes it possible to reduce thermal losses to the exterior.

Moreover, by using only one supply conduit, thermal losses are further reduced.

Moreover, the connector 8 imposes a thermal gradient between the body 2 and the supply conduit(s), this gradient is sufficient so that the temperature in the supply conduit(s) is less than 600° C., the temperature at which auto-ignition generally occurs in stoichiometric conditions. The implementation of a heat insulating connector 6 also makes it possible to use steel tubes.

Figure 4:
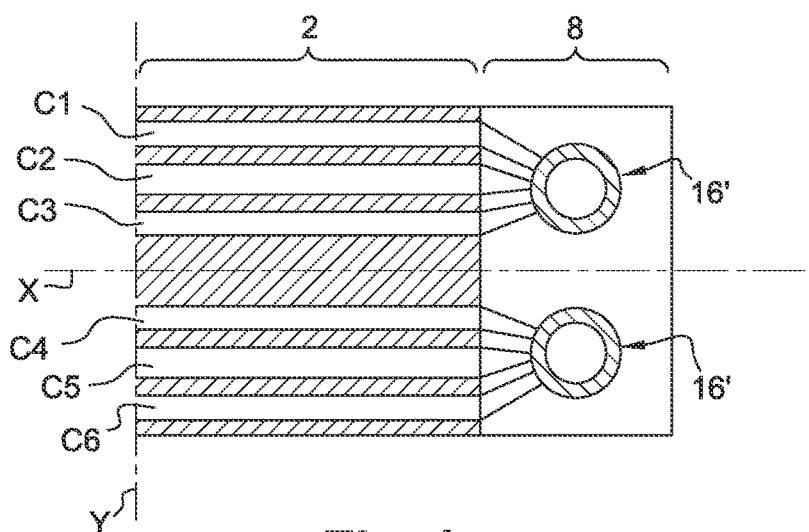
FIG. 4 is a partial sectional view of another example of embodiment of a combustion module according to the invention comprising a heat insulating connector.

In FIG. 4 may be seen a variant of embodiment of the module of FIGS. 3A and 3B in which the connector comprises two supply orifices and two groups of channels each connected to a supply orifice. Moreover, supply orifices 16' are perpendicular to the plane containing the combustion chambers not substantially in the same plane. In this example, the module comprises six combustion chambers C1 to C6. In this example, the chambers C1 and C6 have the greatest section, the chambers C3 and C4 have the smallest section and the chambers C2 and C5 have intermediate sections.

Figure 5:
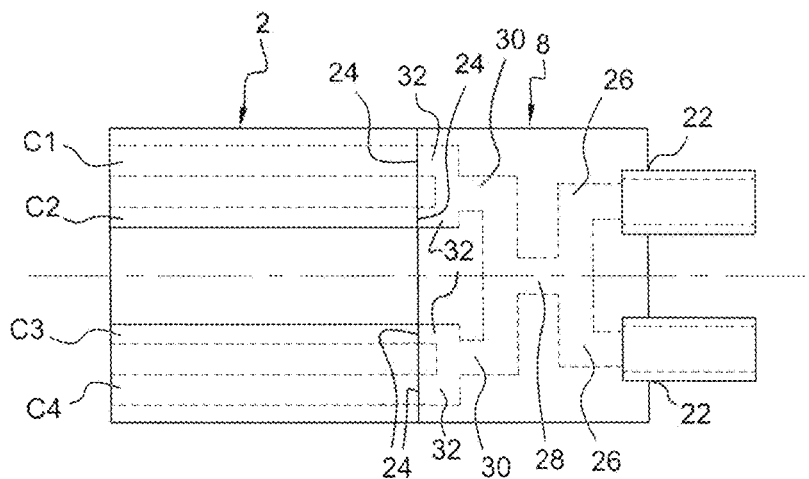
FIG. 5 is a top view of another example of embodiment of a combustion module according to the invention comprising a heat insulating connector.

In FIG. 5 may be seen another example of module in which the supply connector 8 comprises two inlet orifices 22 and four outlet orifices 24 connected to the combustion chambers and a network of channels and sub-channels for connecting the two inlet orifices 22 to the four outlet orifices 24.

The network comprises two first channels 26 each connected to an inlet orifice 22, a mixing chamber 28 in which the two channels 26 emerge, two second channels 30 going from the mixing chamber 28 which each divide into a pair of sub-channels 32 emerging in two outlet orifices 24.

Advantageously, each inlet orifice is connected to a different gas source, for example one is connected to a source of oxygen or air and the other to a source of $H_2$. The two gases are mixed in the mixing chamber 28 before being distributed to the four combustion chambers. This connector avoids having to carry out premixing of the gases before injection into the connector.

Very advantageously, the mixing chamber may comprise means for favoring mixing, for example it may be filled in all or part by a porous structure, for example a stack of beads or a porous material. The structure may be macroporous or then microporous.

Figure 6:
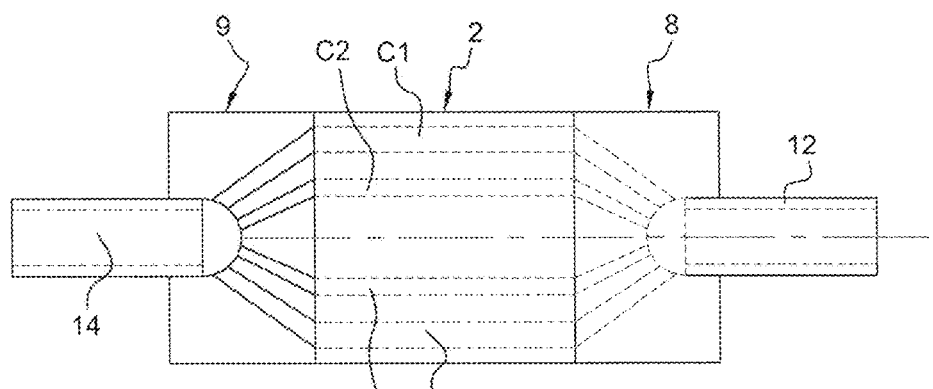
FIG. 6 is a top view of another example of embodiment of a combustion module according to the invention comprising two heat insulating connectors.

The combustion module may also comprise a heat insulting evacuation connector 9 as represented in FIG. 6, which has the effect of reducing thermal losses. Advantageously the material of the evacuation connector 9 also has a thermal conductivity less than 50 W/m.K, preferentially less than 10 W/m.K.

The evacuation connector may have a structure symmetrical to that of the supply connector.

In the case of the supply connector of FIG. 5, the implementation of two outlet orifices and one mixing chamber does not bring any advantage on the evacuation side. Preferably the evacuation connector may have a structure similar to or identical to that of the connector of FIGS. 3A and 3B.

In a variant, it is possible to provide that the connector(s) assure both the supply of certain chambers and the evacuation of certain chambers.

The example of assembly between the connector and the body represented in FIG. 3C applies to all the examples of connector.

In the case of a module of which the body has a dimension along X equal to 25 mm, a dimension along Y equal to 25 mm and a dimension along Z equal to 5 mm, the supply connector and potentially the evacuation connector have a dimension along X of 10 mm for example.

The connector(s) may be made of zirconium oxide, alumina or any other heat insulating material such as mullite. The body of the module may be made of SiC, steel, aluminum, cordierite, etc. The supply and/or evacuation conduits may be made of high temperature steel, nickel-cobalt alloy.

The module in particular the body is preferably produced by machining as well as the combustion chambers.

In the case where the channels in the connector(s) could be of complex shape, the connector(s) may be produced by a molding technology by injection of ceramic powder, to mold for example zirconium oxide, mullite, aluminum oxide, silica nitride.

During a following step, the combustion catalyst may be deposited on the inner surface of the combustion chambers by liquid impregnation or by chemical vapor deposition.

During a following step, the body and the connectors are made integral for example by brazing or by welding.

During a following step, the supply and evacuation tubes are made integral with the connectors, for example by welding or brazing.

It is possible to envisage making the tubes integral with the connectors, before making the connectors integral with the body.

This combustion module may be advantageously implemented to produce a hybrid solar system in which the upper face is subjected to solar radiation and the lower face is in contact with thermoelectric modules, the heat produced by the combustion chamber making it possible to compensate variations in sunlight and to have a substantially continuous and constant operation of the thermoelectric modules. The thermal/electrical conversion may in a variant be assured by a thermophotovoltaic cell converting the infrared radiation emitted into electricity.

Figure 7:
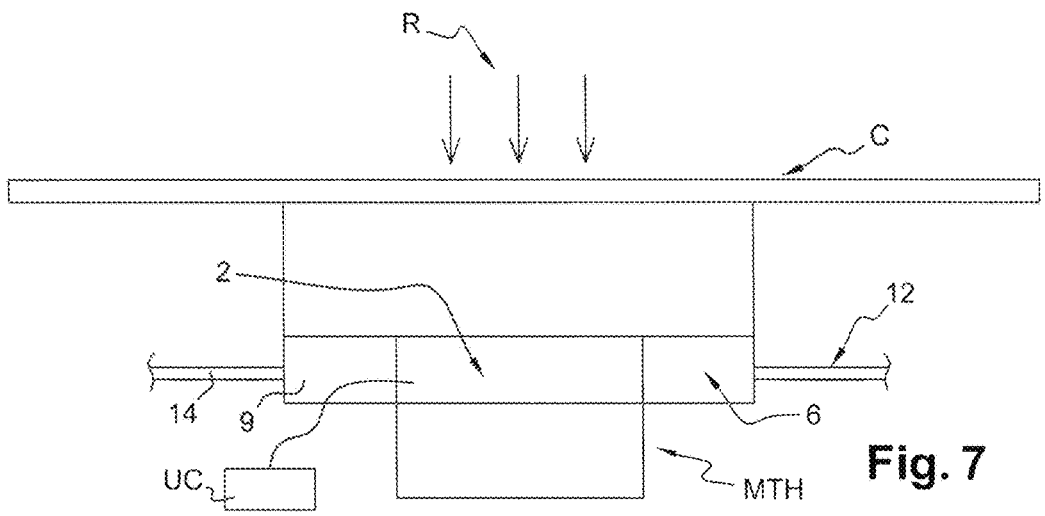
FIG. 7 is a schematic representation of a hybrid solar system comprising a combustion module according to the invention.

In FIG. 7 may be seen a schematic representation of an example of a solar system comprising a combustion module according to the invention. Solar radiation is shown schematically by the arrows R.

The solar system comprises means for concentrating 18 solar radiation, a combustion module M1 arranged opposite the concentration means 32 with respect to the sun such that the upper face of the body is illuminated by concentrated solar radiation and thermoelectric modules MTH of which the hot face is in thermal contact with the lower face of the body of the module. The thermoelectric modules may be replaced by thermophotovoltaic cells placed facing the hot surface and which transform the infrared emission into electricity.

The system comprises means for controlling UC combustion of the chamber in concentrated solar radiation operation so as to maintain a substantially constant temperature on the lower face of the body of the combustion module.

Preferably, the upper surface of the module intended to receive the concentrated solar flux, and in particular the upper surface of the body, is functionalized with a high temperature solar absorber to enable heating by absorption of solar radiation. For example it may be an interferential absorber deposited on the upper surface, such as TiAlN/AlN/SiO$_2$ or a nanostructured refractory material such as molybdenum, tantalum or tungsten.

Preferably, the lower surface of the module, in particular the lower surface of the body, is functionalized with a selective emitter such as a stack of W/Al$_2$O$_3$ or Si/SiO$_2$ or such as a nanostructured refractory material such as molybdenum, tantalum or tungsten.

The lateral surfaces of the module, in particular those of the body, may advantageously be functionalized using a low emissivity material such as a refractory material.

The means for concentrating radiation are for example a Fresnel mirror or lens.

The thermoelectric modules may for example be replaced by any device capable of converting heat into electricity or any other form of energy. As has already been mentioned above, the thermoelectric modules may be replaced by thermophotovoltaic cells placed facing the hot surface and which convert infrared emission into electricity, for example cells based on GaSb.

The operation of the solar system will now be described.

When solar radiation is sufficient it heats the body of the combustion module by striking its upper face after having been concentrated.

Heat is transmitted by conduction through the body up to the lower face thanks to the material of the body between the combustion chambers, a thermal gradient then appears in the thermoelectric modules and electricity is produced. In the case of photovoltaic cells replacing the thermoelectric module, the infrared radiation emitted by the hot surface is absorbed and converted into electricity in the thermophotovoltaic cell.

If radiation is insufficient, for example in the event of cloudy periods or at night time, gases are burned in the combustion chambers, heat is produced, which completes that produced by solar radiation or offsets its absence. A thermal gradient then appears in the thermoelectric modules and electricity is produced. In the case of photovoltaic cells replacing the thermoelectric module, the infrared radiation emitted by the hot surface is absorbed and converted into electricity in the thermophotovoltaic cell.

The combustion module according to the invention is particularly suited to the conversion of thermal energy into electrical energy using thermoelectric modules since it has notably a more uniform temperature of the lower surface in contact with the modules. This also applies in the case where the conversion takes place by thermophotovoltaic cells.

Moreover, by implementing one or more heat insulating connectors, thermal losses to the exterior are reduced, the amount of heat transmitted to the lower face of the module is thus increased.

The invention claimed is:

1. A hybrid solar system comprising:
   a concentrator for concentrating solar radiation;
   at least one combustion module that includes
      a body having a first end face and a second end face, the combustion module being arranged such that concentrated radiation illuminates one face of the body, and
      several combustion chambers formed in said body, and extending parallel to each other along a longitudinal direction between the first end face and the second end face of the body, a distance between the combustion chambers and/or dimensions of the combustion chambers being chosen so as to reduce a temperature gradient transversal to the combustion chambers, wherein
   the body comprises two lateral faces and first combustion chambers situated near to the lateral faces and second combustion chambers arranged between the first combustion chambers, the first combustion chambers having a transversal cross-section greater than the second combustion chambers;
   a convertor for converting thermal energy into electricity on a face opposite to that illuminated by the concentrated solar radiation; and
   a controller for controlling combustion in the combustion module as a function of the concentrated solar radiation.

2. The hybrid solar system according to claim 1, wherein a distance separating two second combustion chambers is greater than a distance separating a first combustion chamber and a second combustion chamber.

3. The hybrid solar system according to claim 1, wherein the combustion chambers are catalytic combustion chambers.

4. The hybrid solar system according to claim 1, further comprising at least one first connector in contact with the first end face of the body and configured to assure the connection between the combustion chambers and at least one source of at least one gas and/or a zone for evacuating combustion gases, said connector having a thermal conductivity substantially lower than that of the body.

5. The hybrid solar system according to claim 4, further comprising a second connector in contact with the second end face of the body and configured to assure the connection between the combustion chambers and at least one source of at least one gas and/or a zone for evacuating combustion gases, said connector having a thermal conductivity substantially lower than that of the body.

6. The hybrid solar system according to claim 4, wherein the first connector is configured to connect the combustion chambers and at least one source of at least one gas, said first connector comprising a supply orifice to be connected to a gas source by a conduit, as many channels as connection chambers, said channels connecting the supply orifice and the combustion chambers.

7. The hybrid solar system according to claim 6, wherein each channel has a section similar to or identical to that of the combustion chamber to which it is connected.

8. The hybrid solar system according to claim 6, wherein the first connector comprises a distribution chamber downstream of the supply orifice and upstream of the channels.

9. The hybrid solar system according to claim 4, wherein the first connector comprises at least two inlet orifices and as many outlet orifices as combustion chambers, a distribution network for distributing gas between inlet orifices and outlet orifices, and a mixing zone situated downstream of the two inlet orifices and upstream of the distribution network.

10. The hybrid solar system according to claim 8, wherein the first connector comprises a structure configured to favor mixing of gases.

11. The hybrid solar system according to claim 1, wherein the body is made of SiC and a supply connector and an evacuation connector are made of zirconium oxide.

12. A The hybrid solar system according to claim 1, further comprising a combustion device including at least one source and one conduit connected to an inlet orifice of a supply connector and to a gas source.

13. A hybrid solar system comprising:
   a concentrator for concentrating solar radiation:
   at least one combustion module that includes
      a body having a first end face and a second end face, the combustion module being arranged such that concentrated radiation illuminates one face of the body, and several combustion chambers formed in the body, and extending parallel to each other along a longitudinal direction between the first end face and the second end face of the body, a distance between the combustion chambers and/or dimensions of the combustion chambers being chosen so as to reduce a temperature gradient transversal to the combustion chambers, wherein the body comprises two lateral faces and first combustion chambers situated near to the lateral faces and second combustion chambers arranged between the first combustion chambers;

a convertor for converting thermal energy into electricity on a face opposite to that illuminated by the concentrated solar radiation; and a controller for controlling combustion in the combustion module as a function of the concentrated solar radiation, wherein a distance between a pair of second combustion chambers is greater than a distance separating a first combustion chamber and a second combustion chamber.

14. The hybrid solar system according to claim 13, wherein the concentrator comprises at least one mirror or Fresnel lens.

15. The combustion module according to claim 3, wherein the catalytic combustion chamber comprises inner surfaces which are at least in part covered with at least one catalyst material configured to cause a combustion of one or more gases.

16. The hybrid solar system according to claim 1, wherein the first combustion chambers have a diameter greater than the second combustion chambers.

* * * * *